(12) United States Patent
Iba et al.

(10) Patent No.: US 6,495,211 B2
(45) Date of Patent: Dec. 17, 2002

(54) PROCESS FOR PRODUCING A SUBSTRATE AND PLATING APPARATUS

(75) Inventors: Masahiro Iba, Aichi (JP); Hisashi Wakako, Aichi (JP); Kazuhisa Sato, Aichi (JP); Hiroyuki Hashimoto, Aichi (JP); Yasuo Doi, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/882,016

(22) Filed: Jun. 18, 2001

(65) Prior Publication Data

US 2001/0053562 A1 Dec. 20, 2001

(30) Foreign Application Priority Data

Jun. 19, 2000 (JP) ........................................ 2000-183126

(51) Int. Cl.$^7$ ............................... B05D 3/10; B05D 1/18
(52) U.S. Cl. ................. 427/398.3; 427/353; 427/430.1; 427/438; 427/443.1
(58) Field of Search ................................ 427/98, 430.1, 427/436, 437, 438, 443.1, 398.3, 353

(56) References Cited

U.S. PATENT DOCUMENTS

| | | | | |
|---|---|---|---|---|
| 4,675,272 A | * | 6/1987 | Siskind | ........................ 430/131 |
| 4,781,806 A | * | 11/1988 | Tenace et al. | ............... 204/149 |
| 5,667,849 A | * | 9/1997 | Carey, II et al. | ............ 427/431 |
| 5,730,853 A | * | 3/1998 | Smith et al. | ................ 205/210 |

FOREIGN PATENT DOCUMENTS

| | | |
|---|---|---|
| JP | 7-927 | 1/1995 |
| JP | 7-326848 | 12/1995 |
| JP | 10-4254 | 1/1998 |

* cited by examiner

*Primary Examiner*—Michael Barr
(74) *Attorney, Agent, or Firm*—Sughrue Mion, PLLC

(57) ABSTRACT

A process for producing a substrate 1 having a base-metal plating layer, which includes an immersion step for immersing the substrate 1 in a plating solution contained in a plating tank 33, to thereby form a base-metal plating layer; a washing step for removing the substrate 1 from the plating tank 33, transferring the substrate 1 to a washing tank, and washing the substrate 1; and a cooling step for applying a cooling liquid to the substrate 1 during at least a portion of the period during which the substrate is transferred to a position where the washing step is carried out after completing the immersion step, to thereby cool the substrate 1. An apparatus for carrying out the above process is also disclosed.

4 Claims, 6 Drawing Sheets

PRIOR ART

PROCESS FOR PRODUCING A SUBSTRATE AND PLATING APPARATUS

BACKGROUND OF THE INVENTION

1. Field of the Invention

The present invention relates to a process for producing a substrate including a plating layer and to a plating apparatus for forming a plating layer of a substrate; and, more particularly, to a process for producing a substrate including a base-metal plating layer and to a plating apparatus for forming a base-metal plating layer.

2. Description of the Related Art

Conventionally, a substrate including a layer plated with a base metal such as Ni has been known. For example, in a wiring substrate on which an IC chip is to be provided, usually, an Ni-plating layer (base-metal plating layer) is formed on a connection terminal formed from Cu, and an Au-plating layer is formed on the Ni-plating layer in order to prevent oxidation of the Ni-plating layer.

Such a plating layer of a wiring substrate is formed as follows. A wiring substrate on which an Ni-plating layer is to be formed is subjected to Pd activation treatment before plating, and then the wiring substrate is washed with water.

After washing with water, the wiring substrate is immersed for a predetermined period of time in an Ni-plating solution contained in an Ni-plating tank, to thereby form on a connection terminal of the wiring substrate an Ni-plating layer of predetermined thickness.

Specifically, as shown in FIG. 6, after being washed with water, wiring substrates 101 are transferred horizontally to a position above an Ni-plating tank 111 by means of a transfer mechanism 103. The transfer mechanism 103 includes a rack 105 for holding a number of the wiring substrates 101, a vertical transfer mechanism 107 for transferring the rack 105 vertically, and a horizontal transfer mechanism 109 for transferring the rack 105 horizontally.

Subsequently, from the position above the Ni-plating tank 111, the rack 105 is moved downward by means of the vertical transfer mechanism 107, and the rack 105 (along with the wiring substrates 101) is immersed for a predetermined period of time in an Ni-plating solution contained in the Ni-plating tank 111.

After a n Ni-plating layer is formed on each of the wiring substrates 101, the rack 105 is removed from the Ni-plating tank 111 by means of the vertical transfer mechanism 107. Subsequently, the rack 105 is transferred, by means of the horizontal transfer mechanism 109, to a position above a washing tank 113 containing washing water.

Thereafter, the rack 105 is moved downward by means of the vertical transfer mechanism 107, and the rack 105 is immersed f or a predetermined period of time in the water contained in the washing tank 113, to thereby wash the wiring substrates 101.

After the substrates are washed, the rack 105 is removed from the washing tank, and transferred to a position above an Au-plating tank (not illustrated) containing an Au-plating solution. Subsequently, the rack 105 is immersed for a predetermined period of time in the Au-plating solution contained in the Au-plating tank, to thereby form an Au-plating layer on the Ni-plating layer formed on each of the wiring substrates 101.

Thereafter, the rack 105 is removed from the Au-plating tank, transferred to the subsequent washing tank (not illustrated) containing washing water, and immersed in the water contained in the washing tank, to thereby wash the wiring substrates 101. Subsequently, the wiring substrates 101 are dried. Thus, the Ni-plating layer and Au-plating layer are formed on a connection terminal of each of the wiring substrates 101.

3. Problems to be Solved by the Invention

However, in the aforementioned production process, a certain time elapses from the time the rack 105 (along with the wiring substrates 101) is removed from the Ni-plating tank 111 until the rack 105 is immersed in the water contained in the washing tank 113. In addition, when the Ni-plating layer is formed, the wiring substrates 101 are heated, since the Ni-plating solution contained in the Ni-plating tank 111 is heated at about 70–90° C. Therefore, during transfer of the wiring substrate 101, the Ni-plating layer formed on the wiring substrate 101 is exposed to air, while the temperature of the layer is maintained at a high level.

Consequently, during transfer of the wiring substrate 101, the Ni-plating solution which remains on the substrate may oxidize, leading to problems such as blackening of the surface of the Ni-plating layer and formation of a thin oxidation film. In such cases, when solder bumps are formed on the connection terminal of the wiring substrate 101 on which the Ni-plating layer has been formed, the bonding strength between the Ni-plating layer and the solder may be lowered, thereby lowering the bonding reliability.

SUMMARY OF THE INVENTION

In view of the foregoing, an object of the present invention is to provide a process for producing a substrate which prevents oxidation of residual Ni-plating solution and accompanying problems, including discoloration of a base-metal plating layer and lowering of bonding strength; and a plating apparatus therefor.

The present invention achieves the above object by providing a process for producing a substrate including a base-metal plating layer, which process comprises an immersion step for immersing a substrate in a plating solution contained in a plating tank, to thereby form a base-metal plating layer on a substrate; a washing step which comprises removing the substrate from the plating tank, transferring the substrate to a washing tank, and washing the substrate; and a cooling step which comprises applying cooling liquid to the substrate during at least a portion of the period during which the substrate is being transferred to the washing tank after completing the immersion step, to thereby cool the substrate.

According to the present invention, while the substrate which has undergone the immersion step is removed from the plating tank and is being transferred to a position where the washing step is carried out, cooling liquid is applied to the substrate, to thereby cool the substrate. When cooling liquid is applied during the substrate transfer step, the period of time during which the heated substrate (as heated in the plating tank) is exposed to air is shortened.

Consequently, during transfer of the substrate, plating solution which remains on the substrate is less likely to oxidize, thereby making the substrate less prone to accompanying problems, including blackening of the surface of the plating layer and formation of a thin oxidation film. Therefore, when solder bumps are formed on the plating layer, the bonding strength between the plating layer and the solder is not lowered, and bonding reliability can be enhanced.

The cooling liquid is not particularly limited, so long as the solution can cool the substrate. For example, the cooling liquid may be water, pure water, a plating solution, or a washing solution. The temperature of the cooling liquid is not particularly limited, so long as the cooling liquid can cool the substrate to a temperature so as to suppress reaction of the plating solution which remains on the substrate. The temperature of the cooling liquid may be ambient temperature. The cooling liquid itself may be cooled. Alternatively, the cooling liquid may be heated to some extent, so long as the temperature of the cooling liquid is lower than that of the plating solution contained in the plating tank.

The cooling step may be carried out continuously over the entire substrate-transfer period during which the substrate is transferred from the plating tank to the subsequent washing tank, or during a portion of the transfer period.

In the cooling step of the aforementioned process for producing a substrate, preferably, the cooling liquid is applied to the substrate while the substrate is being removed from the plating tank, to thereby cool the substrate.

In this case, the substrate is cooled simultaneously with removal from the plating tank, thereby minimizing the time during which the plating layer of the heated substrate is exposed to air at high temperature during transfer of the substrate from the plating tank to the subsequent washing tank.

Consequently, the occurrence of problems including oxidation of the surface of the plating layer can be more reliably prevented, and thus a highly reliable substrate can be produced.

In the cooling step of the aforementioned processes for producing a substrate, preferably, the cooling liquid is sprayed obliquely upward, and, when falling as a result of spraying, the cooling liquid is applied to the substrate from above the substrate. When the cooling liquid is sprayed in such a manner, the cooling liquid is easily atomized in air. Therefore, the cooling liquid can be uniformly applied to the substrate, to thereby cool the substrate uniformly.

Moreover, the temperature of the cooling liquid is preferably ambient temperature. This is because, when at ambient temperature, the cooling liquid can cool the substrate satisfactorily, thereby preventing problems including oxidation of the plating layer. In addition, employing a cooling liquid of ambient temperature obviates a step specifically for cooling or heating the cooling liquid, and thus costs incurred by the cooling step can be reduced.

In the aforementioned processes for producing a substrate, the cooling liquid is preferably pure water.

In a preferred embodiment of the present invention, pure water is used as the cooling liquid. Therefore, an apparatus for applying the cooling liquid to the substrate can be simplified, as compared with the case in which a plating solution, a washing solution, or a similar solution is used as the cooling liquid. Moreover, in the case in which pure water is used as the cooling liquid, when the cooling liquid is applied to the substrate to thereby cool the substrate above the plating tank, and the cooling liquid falls from the substrate into the tank and is mixed with the plating solution, the plating solution is not adversely affected. Similarly, use of pure water as the cooling liquid is advantageous, because when the cooling liquid is applied to the substrate to thereby cool the substrate above the washing tank, and the cooling liquid falls from the substrate into the tank, the washing solution in the tank is not adversely affected. In addition, even when the cooling liquid falls from the substrate onto the floor, the cooling liquid is relatively easily disposed of.

In the aforementioned processes for producing a substrate, the base-metal plating layer is preferably an Ni-plating layer predominantly containing Ni.

According to the present invention, an Ni-plating layer predominantly containing Ni is formed in the immersion step. When the Ni-plating layer is formed on the substrate, while the substrate is transferred from the plating tank to the washing tank, the surface of the Ni-plating layer is easily oxidized, particularly at high temperature. Therefore, as described above, when the cooling step is carried out during transfer of the substrate, and the substrate is cooled by the cooling liquid, occurrence of problems, including oxidation of the surface of the Ni-plating layer, can be effectively prevented.

The present invention also provides a plating apparatus for forming a base-metal plating layer on a substrate, which comprises a plating tank for storing a plating solution; a washing tank for storing a washing solution; transfer means for removing from the plating tank a substrate on which a base-metal plating layer has been formed, transferring the substrate to the washing tank, and immersing the substrate into a washing solution contained in the washing tank; and cooling means for applying a cooling liquid to the substrate removed from the plating tank.

According to the present invention, the plating apparatus includes the plating tank, the washing tank, the transfer means, and the cooling means. When the substrate on which the base-metal plating layer has been formed is removed from the plating tank, the cooling means allows the cooling liquid to be applied to the substrate so that the substrate is cooled.

Thus, when the substrate is cooled while being removed from the plating tank, during transfer of the substrate from the plating tank to the washing tank, the time during which the heated substrate is exposed to air at high temperature is shortened. Consequently, during transfer of the substrate, residual plating solution is less likely to oxidize, thereby preventing accompanying problems, including blackening of the surface of the plating layer. Therefore, when solder bumps are formed on the plating layer, the bonding strength between the plating layer and the solder is not lowered, and bonding reliability can be enhanced.

In the cooling means of the aforementioned plating apparatus, preferably, the cooling liquid is sprayed obliquely upward, and, when falling as a result of spraying, the cooling liquid is applied to the substrate from above the substrate, thus effecting cooling of the substrate. Therefore, since the sprayed cooling liquid is easily atomized in air, the cooling liquid can be uniformly applied to the substrate, to thereby cool the substrate uniformly.

DESCRIPTION OF REFERENCE NUMERALS

Figure 1:
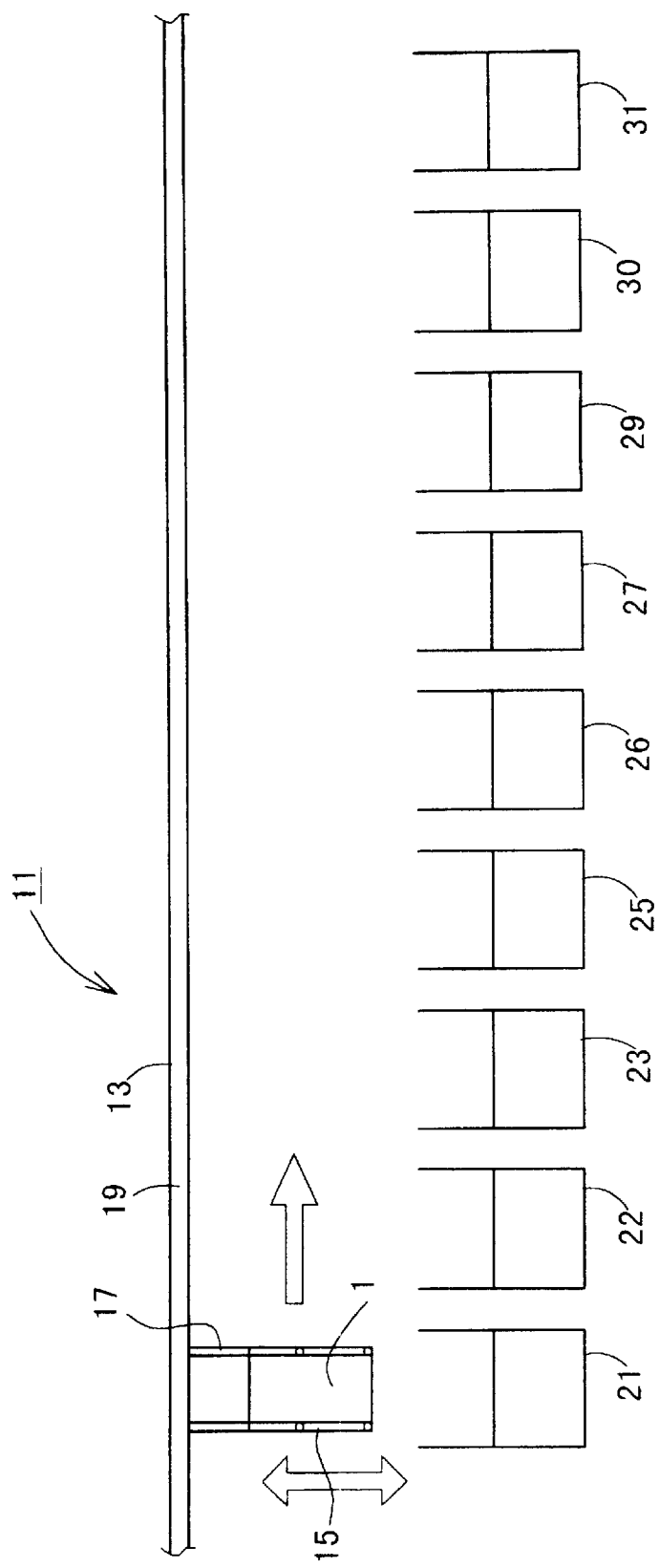
FIG. 1 is an explanatory view showing an acid-degreasing tank through a sixth washing tank of a plating apparatus according to an embodiment of the present invention.

1: Wiring substrate (substrate)
11: Plating apparatus
13: Transfer mechanism (transfer means)
15: Rack
17: Vertical transfer mechanism
19: Horizontal transfer mechanism
33: Ni-plating tank
34: Seventh washing tank
37: Au-plating tank
38: Ninth washing tank
41: Cooling mechanism (cooling means)
43: Spray tube
44: Spray hole
45: Spray nozzle

DETAILED DESCRIPTION OF THE INVENTION

An embodiment of the present invention will next be described with reference to the drawings. However, the present invention should not be construed as being limited thereto.

Figure 2:
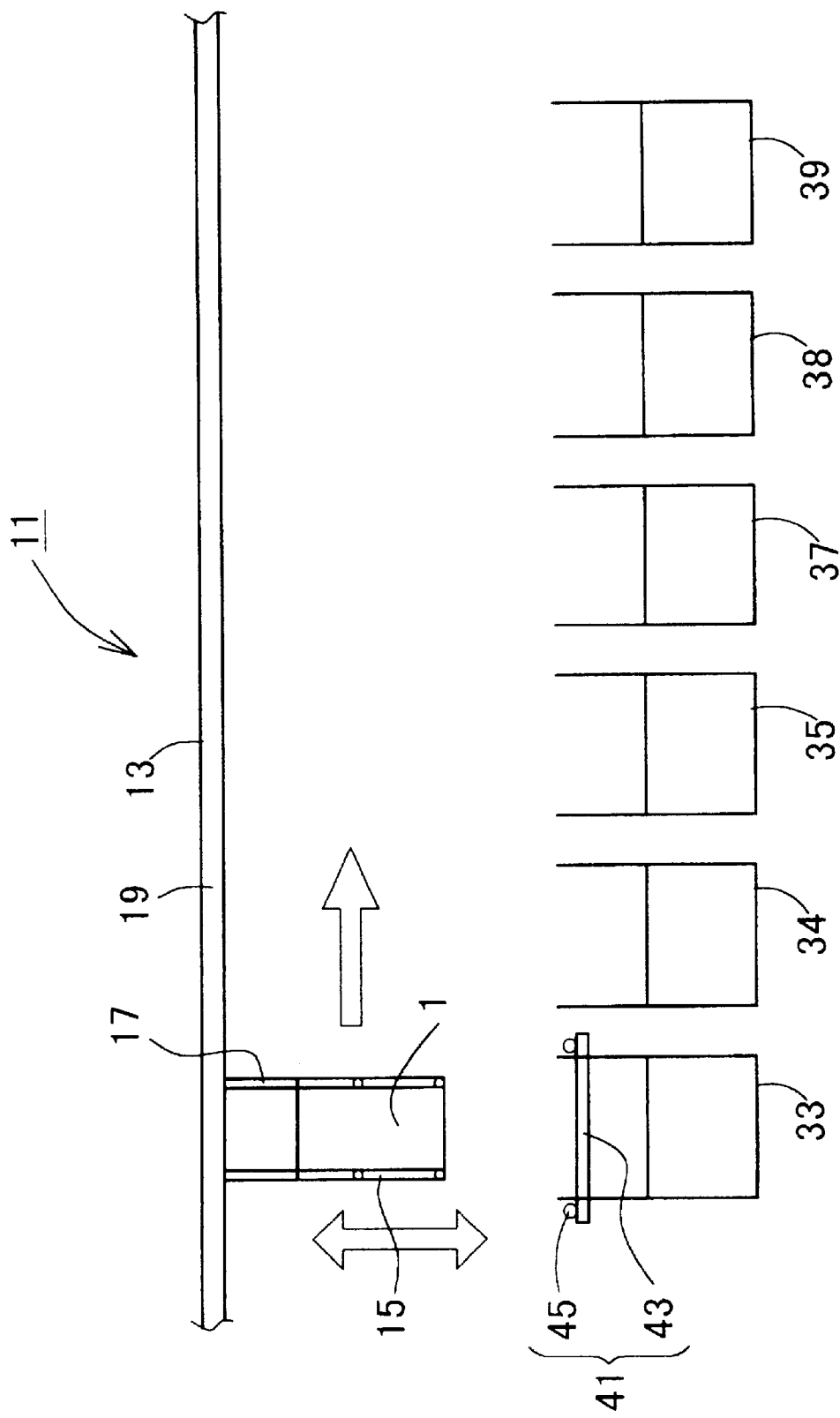
FIG. 2 is an explanatory view showing an Ni-plating tank through a tenth washing tank of the plating apparatus according to an embodiment of the present invention.
Figure 3:
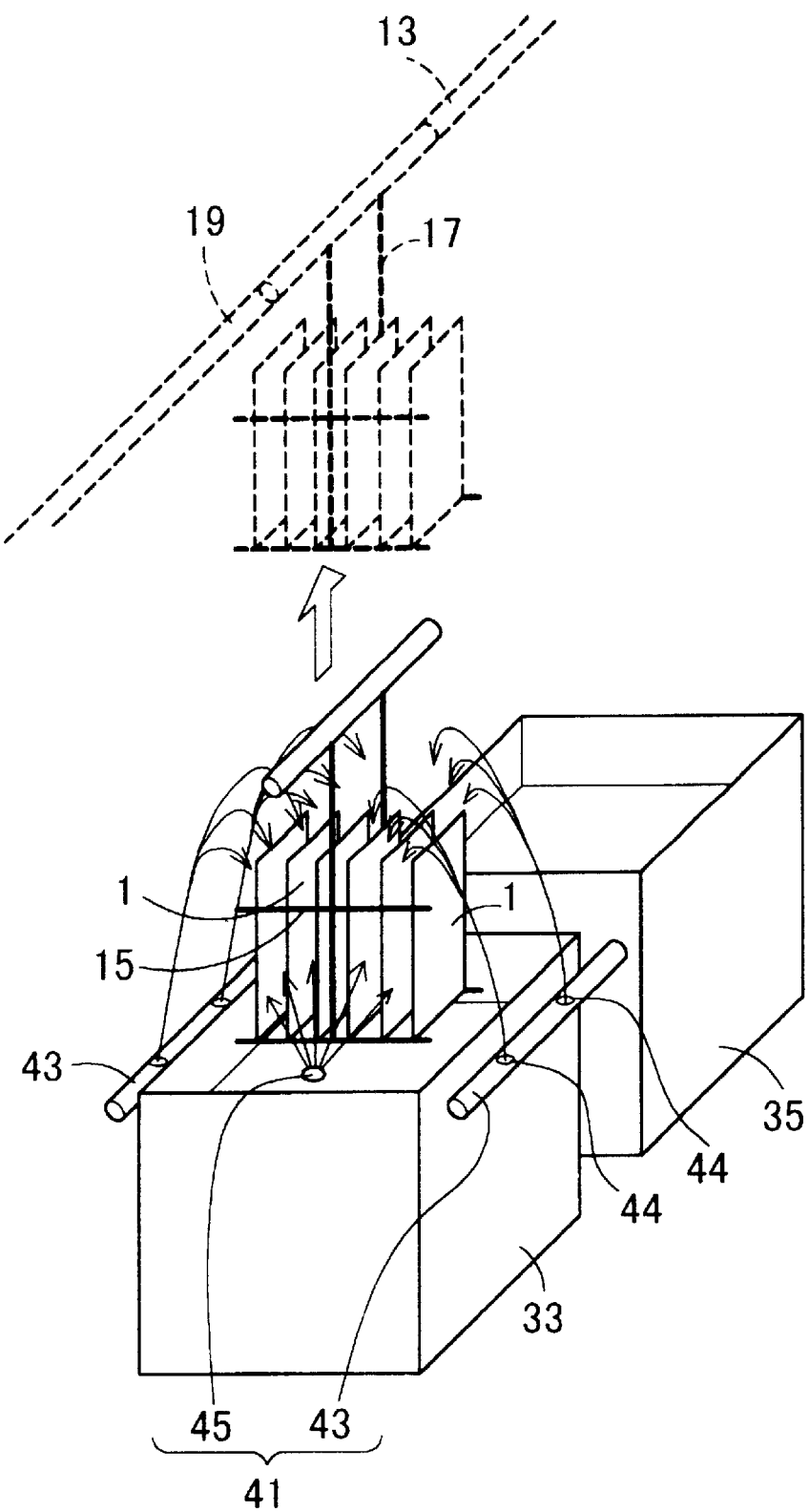
FIG. 3 is an explanatory view showing the vicinity of the Ni-plating tank and the seventh washing tank of the plating apparatus according to an embodiment of the present invention.

In relation to a plating apparatus 11 of the present embodiment, FIG. 1 is an explanatory view showing an acid-degreasing tank 21 through a sixth washing tank 31; FIG. 2 is an explanatory view showing an Ni-plating tank 33 through a tenth washing tank 39; and FIG. 3 is an explanatory view showing the vicinity of an Ni-plating tank 33 and a seventh washing tank 34.

The plating apparatus 11 includes a transfer mechanism (transfer means) 13 for transferring wiring substrates 1. The transfer mechanism 13 includes a rack 15 for holding a number of the wiring substrates 1, a horizontal transfer mechanism 19 for transferring the rack 15 horizontally, and a vertical transfer mechanism 17 for transferring the rack 15 vertically.

As shown in FIG. 1, the plating apparatus 11 also includes an acid-degreasing tank 21 for acid-degreasing the wiring substrates 1 to thereby remove stains from the substrates 1, and a first washing tank 22 and a second washing tank 23 for washing residual acid off the wiring substrates 1 which have undergone acid-degreasing. The plating apparatus 11 also includes a sulfuric acid tank 25 for washing the wiring substrates 1 with sulfuric acid, and a third washing tank 26 and a fourth washing tank 27 for washing residual sulfuric acid off the wiring substrates 1 which have undergone washing with sulfuric acid. The plating apparatus 11 also includes a Pd activation treatment tank 29 for subjecting the wiring substrates 1 to Pd activation treatment before plating, and a fifth washing tank 30 and a sixth washing tank 31 for washing the wiring substrates 1 which have undergone Pd activation treatment.

As shown in FIG. 2, the plating apparatus 11 also includes an Ni-plating tank 33 for forming an Ni-plating layer containing Ni-P on the wiring substrates 1, and a seventh washing tank 34 and an eighth washing tank 35 for washing residual Ni-plating solution off the wiring substrates 1 which have undergone Ni-plating. The plating apparatus 11 also includes an Au-plating tank 37 for forming an Au-plating layer on the Ni-plating layer of the wiring substrates 1, and a ninth washing tank 38 and a tenth washing tank 39 for washing residual plating solution off the wiring substrates 1 which have undergone Au-plating.

Of these tanks, the Ni-plating tank 33 includes a cooling mechanism (cooling means) 41, as shown in FIGS. 2 and 3. The cooling mechanism 41 includes two spray tubes 43 having a plurality of spray holes 44 for spraying pure water in an oblique upward direction of ambient temperature serving as a cooling liquid (in the present embodiment, the pure water is sprayed at an inclination of about 85° with respect to the horizontal plane) in a fountain-like manner. These spray tubes 43 are provided in the vicinity of the upper periphery of the Ni-plating tank 33 so as to be parallel to the transfer direction of the rack 15. The cooling mechanism 41 also includes a plurality of spray nozzles 45 for atomizing and jetting the cooling liquid in a substantially horizontal direction. These spray nozzles 45 are provided along specific sides of the upper periphery of the Ni-plating tank 33, the sides being perpendicular to the transfer direction of the rack 15.

According to the present embodiment, water serving as a washing solution is contained in the first washing tank 22, the third washing tank 26, the fifth washing tank 30, the seventh washing tank 34, and the ninth washing tank 38, each of the washing tanks being provided immediately after one of the tanks in which the wiring substrates 1 are treated with a chemical solution. Pure water serving as a washing solution is also contained in the second washing tank 23, the fourth washing tank 27, the sixth washing tank 31, the eighth washing tank 35, and the tenth washing tank 39, each of the washing tanks being provided immediately after one of the above washing tanks. The temperature of the washing solutions contained in the above washing tanks exclusive of the eighth washing tank 35 and the tenth washing tank 39 is ambient temperature. The washing solutions contained in the eighth washing tank 35 and the tenth washing tank 39 are heated.

A process for producing a wiring substrate 1 making use of the plating apparatus 11 will next be described with reference to the drawings. However, the present invention should not be construed as being limited thereto.

Firstly, a wiring substrate 1 on which an Ni-plating layer is to be formed is produced. The wiring substrate 1 used in the present embodiment includes a main surface and a back surface and has a substantially plate-like shape. The main surface includes a Cu connection terminal exposed on the surface and formed at a position to which the connection terminal of an IC chip is to be connected. The back surface includes a Cu connection terminal exposed thereon and formed at a position to which the connection terminal of a motherboard is to be connected. The wiring substrate 1 is produced by laminating resin insulating layers and conductive layers alternately by a known technique.

Subsequently, a predetermined number of the wiring substrates 1 are placed in the rack 15 of the transfer mechanism 13. Using the procedure shown in the flowcharts of FIGS. 4 and 5, an Ni-plating layer is formed on each of the connection terminals on the main and back surfaces of the individual wiring substrates 1, and an Au-plating layer is formed on the Ni-plating layer.

After a predetermined number of the wiring substrates 1 are placed in the rack 15, in step S1, the wiring substrates 1 are subjected to acid-degreasing, to thereby remove stains such as oil from the substrates 1.

Specifically, as shown in FIG. 1, the rack 15 containing the wiring substrates 1 is transferred horizontally to a position above the acid-degreasing tank 21 by means of the horizontal transfer mechanism 19 of the transfer mechanism 13. Subsequently, the rack 15 is moved downward by means of the vertical transfer mechanism 17 of the transfer mechanism 13, and the wiring substrates 1 are immersed in an acid-degreasing solution contained in the acid-degreasing tank 21, to thereby subject the substrates 1 to acid-degreasing. Thereafter, the rack 15 is removed from the acid-degreasing tank 21 by means of the vertical transfer mechanism 17, and is transferred horizontally to a position above the first washing tank 22 (the subsequent tank) by means of the horizontal transfer mechanism 19.

Subsequently, in step S2, the acid-degreasing solution, which has been applied onto the wiring substrates 1 in step SI, is washed off the substrates 1. In step S3, the wiring substrates 1 are washed further.

Specifically, the rack 15 is moved downward by means of the vertical transfer mechanism 17, and the wiring substrates 1 are immersed in a washing solution contained in the first washing tank 22, to thereby wash the substrates 1. Subsequently, the rack 15 is removed from the first washing tank 22 by means of the vertical transfer mechanism 17, and is transferred horizontally to a position above the second washing tank 23 by means of the horizontal transfer mechanism 19. Then, the rack 15 is moved downward by means of the vertical transfer mechanism 17, and the wiring substrates 1 are immersed in a washing solution contained in the second washing tank 23, to thereby wash the substrates 1. Thereafter, the rack 15 is removed from the second washing tank 23 by means of the vertical transfer mechanism 17, and is transferred to a position above the sulfuric acid tank 25 (the subsequent tank) by means of the horizontal transfer mechanism 19.

Subsequently, in step S4, the wiring substrates 1 are treated with sulfuric acid, to thereby remove oxidation film from the surface of the Cu terminals formed on the main and back surfaces of the individual substrates 1. Removal of the oxidation film enables uniform application of Pd onto the Cu terminals in the below-described step S7.

Specifically, the rack 15 is moved downward by means of the vertical transfer mechanism 17, and the wiring substrates 1 are immersed in sulfuric acid contained in the sulfuric acid tank 25. Thereafter, the rack 15 is removed from the sulfuric acid tank 25 by means of the vertical transfer mechanism 17, and is transferred to a position above the third washing tank 26 by means of the horizontal transfer mechanism 19.

Subsequently, in step S5, residual sulfuric acid, which has been applied onto the wiring substrates 1 in the step S4, is washed off the substrates 1. In step S6, the wiring substrates 1 are washed further.

Specifically, the rack 15 is moved downward by means of the vertical transfer mechanism 17, and the wiring substrates 1 are immersed in a washing solution contained in the third washing tank 26, to thereby wash the substrates 1. Subsequently, the rack 15 is removed from the third washing tank 26 by means of the vertical transfer mechanism 17, and is transferred horizontally to a position above the fourth washing tank 27 by means of the horizontal transfer mechanism 19. Then, the rack 15 is moved downward by means of the vertical transfer mechanism 17, and the wiring substrates 1 are immersed in a washing solution contained in the fourth washing tank 27, to thereby wash the substrates 1. Thereafter, the rack 15 is removed from the fourth washing tank 27 by means of the vertical transfer mechanism 17, and is transferred to a position above the Pd activation treatment tank 29 (the subsequent tank) by means of the horizontal transfer mechanism 19.

Subsequently, in step S7, prior to plating, Pd, serving as nuclei for forming the below-described Ni-plating layer, is deposited onto the surface of the connection terminals formed on the main and back surfaces of the individual wiring substrates 1.

Specifically, the rack 15 is moved downward by means of the vertical transfer mechanism 17, and the wiring substrates 1 are immersed in a Pd activation solution, to thereby subject the wiring substrates 1 to Pd activation treatment. Thereafter, the rack 15 is removed from the Pd activation treatment tank 29 by means of the vertical transfer mechanism 17, and is transferred to a position above the fifth washing tank 30 by means of the horizontal transfer mechanism 19.

Subsequently, in step S8, residual Pd activation solution, which has been applied onto the wiring substrates 1 in step S7, is washed off the substrates 1. In step S9, the wiring substrates 1 are washed further.

Specifically, the rack 15 is moved downward by means of the vertical transfer mechanism 17, and the wiring substrates 1 are immersed in a washing solution contained in the fifth washing tank 30, to thereby wash the substrates 1. Subsequently, the rack 15 is removed from the fifth washing tank 30 by means of the vertical transfer mechanism 17, and is transferred to a position above the sixth washing tank 31 by means of the horizontal transfer mechanism 19. Then, the rack 15 is moved downward by means of the vertical transfer mechanism 17, and the wiring substrates 1 are immersed in a washing solution contained in the sixth washing tank 31, to thereby wash the substrates 1. Thereafter, the rack 15 is removed from the sixth washing tank 31 by means of the vertical transfer mechanism 17, and is transferred to a position above the Ni-plating tank 33 (the subsequent tank) by means of the horizontal transfer mechanism 19.

Subsequently, in step S10, an Ni-plating layer containing Ni-P and having a predetermined thickness is formed on the surface of the connection terminals on the main and back surfaces of the wiring substrates 1.

Figure 5:
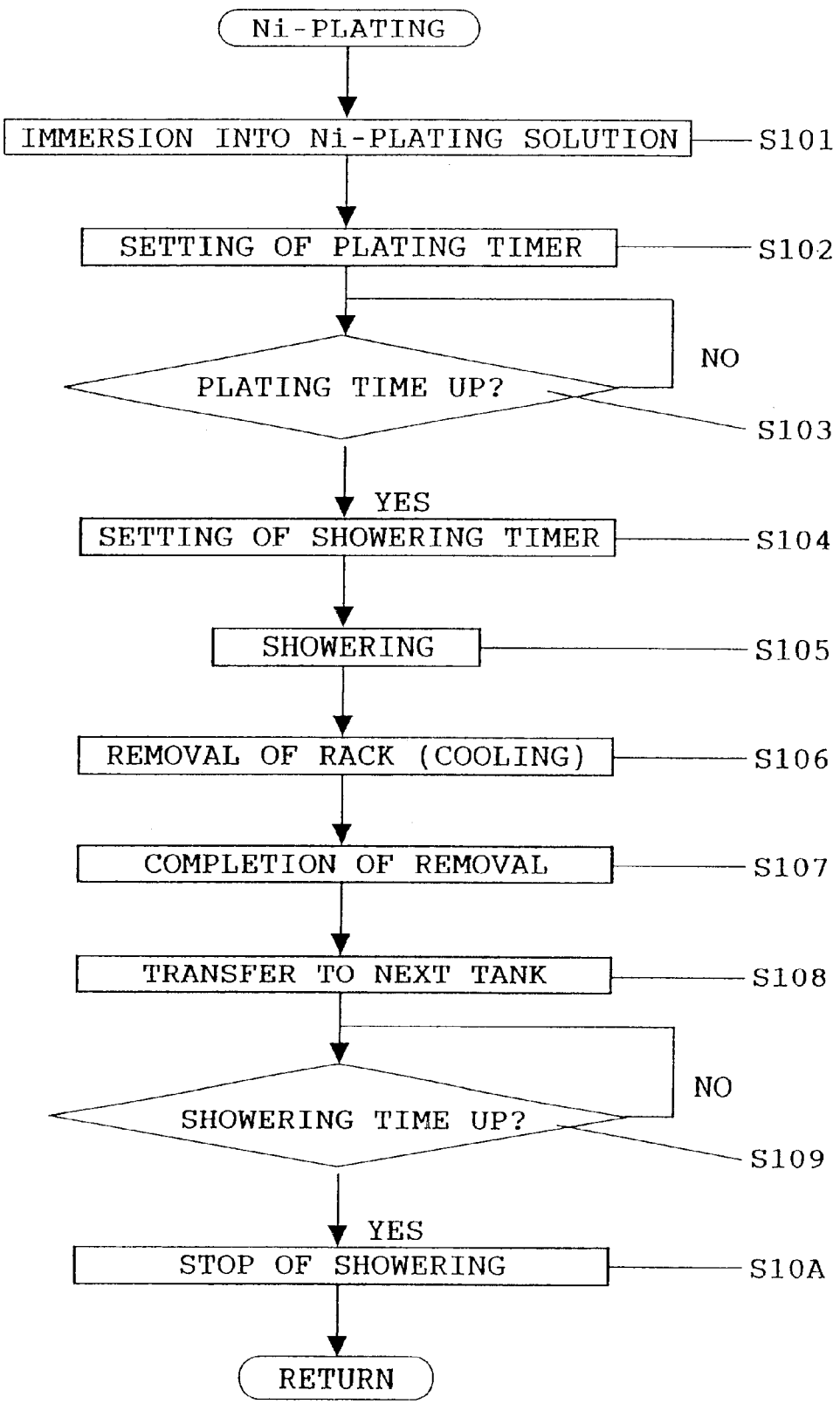
FIG. 5 is a flowchart showing the step for forming the Ni-plating layer of the process for producing a substrate according to an embodiment of the present invention.
Figure 6:
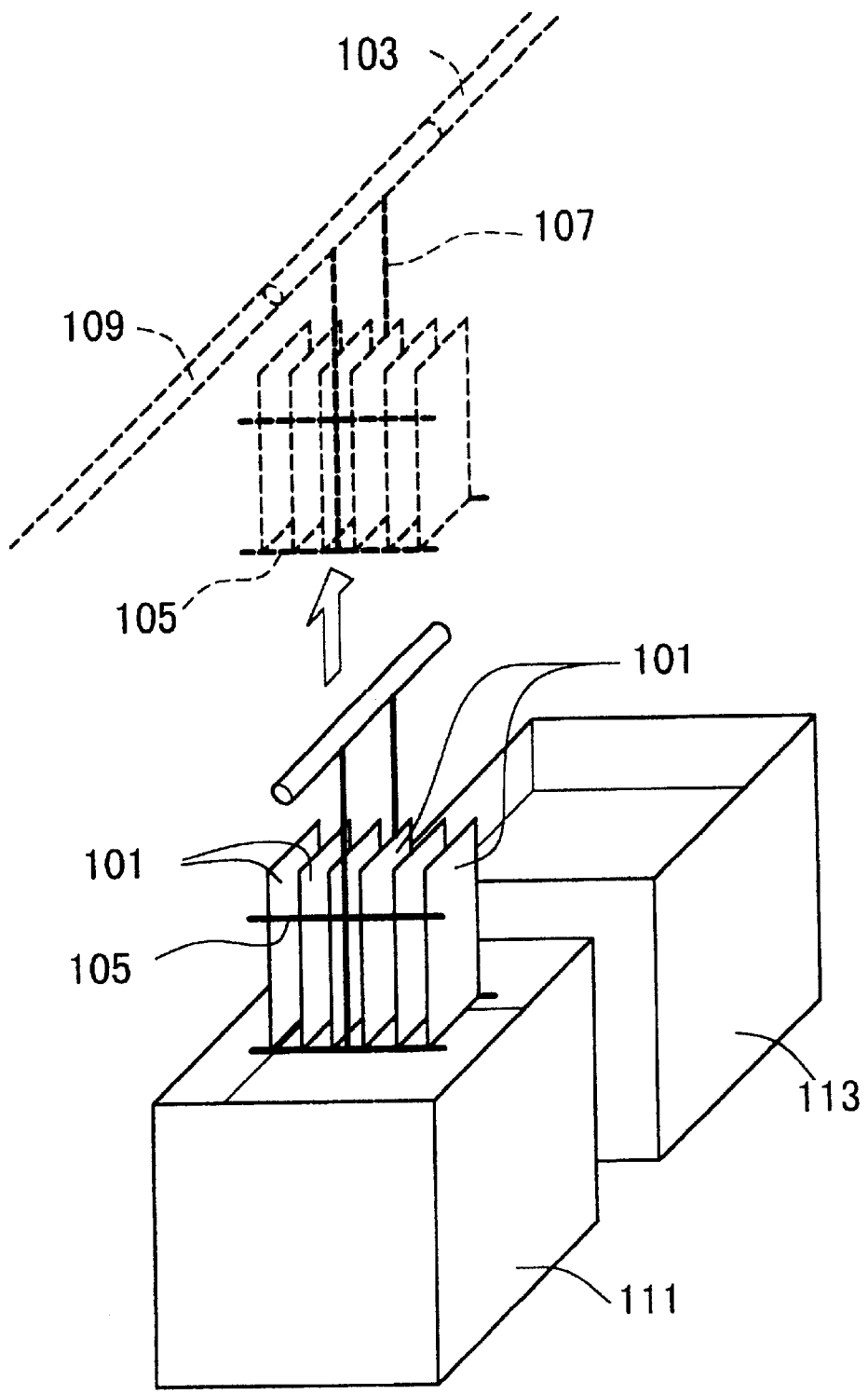
FIG. 6 is an explanatory view showing the vicinity of an Ni-plating tank and a washing tank of a plating apparatus according to the conventional art.

The subroutine of step S10 is shown in the flowchart of FIG. 5. In step S101, the rack 15 is moved downward by means of the vertical transfer mechanism 19, and the wiring substrates 1 are immersed in an Ni-P plating solution for a predetermined time. After the rack 15 is immersed in the plating solution contained in the Ni-plating tank 33, in step S102, a timer is set for measuring a predetermined plating time. In step S103, the wiring substrates 1 are immersed in the plating solution for a predetermined plating time. After the plating time elapses, step S104 is carried out. In step S104, a timer is set for measuring a showering time. Subsequently, in step S105, a cooling liquid is sprayed through the spray holes 44 and the spray nozzles 45 of the cooling mechanism 41.

Subsequently, in step S106, the rack 15 is removed from the Ni-plating tank 33 by means of the vertical transfer mechanism 17. When the rack 15 is removed from the tank 33, the cooling liquid is applied to the wiring substrates 1 as they move upward, to thereby cool the substrates 1. In step S107, removal of the rack 15 is completed. In step S108, the rack 15 is transferred to the seventh washing tank 34 (the subsequent tank) by means of the horizontal transfer mechanism 19. In step S109, a determination is made as to whether or not a predetermined showering time has elapsed. When the showering time has elapsed, spraying of the cooling liquid from the cooling mechanism 41 is stopped in step S10A. Thereafter, leaving the subroutine of the step S10, the production of the wiring substrates 1 proceeds according to the main routine.

Conventionally, wiring substrates 1 having been heated in the Ni-plating tank 33 are transferred, without being cooled as described above, to the seventh washing tank 34, while the heated substrates 1 are exposed to air. Therefore, during transfer of the substrates 1, residual plating solution on the substrates 1 may oxidize, resulting in problems such as blackening of the surface of the Ni-plating layer or formation of a thin oxidation film.

However, according to this embodiment, while the wiring substrates 1 are removed from the Ni-plating tank 33 and transferred to the seventh washing tank 34, the substrates 1 are cooled by applying the cooling liquid thereto. Therefore, the time during which the substrates 1 heated in the Ni-plating tank 33 are exposed to air at high temperature is shortened, and thus the aforementioned problems can be prevented.

In addition, the wiring substrates 1 are cooled by applying the cooling liquid simultaneously with removal from the Ni-plating tank 33. Therefore, the time during which the substrates 1 of high temperature are exposed to air is minimized, and thus the aforementioned problems can be prevented most reliably.

In the present embodiment, as shown in FIG. 3, the cooling liquid is sprayed obliquely upward from the spray holes 44 of the spray tubes 43, and the falling cooling liquid is applied to the wiring substrates 1. Therefore, the cooling liquid is easily atomized, and thus the solution can be uniformly applied to the substrates 1, to thereby cool the substrates 1 uniformly.

In addition, since the cooling liquid is used at ambient temperature, a step for cooling or heating the cooling liquid is not required, and thus costs incurred by the cooling step can be reduced.

In this embodiment, pure water is used as the cooling liquid. Therefore, an apparatus for applying the cooling liquid to the wiring substrates 1 can be simplified, as compared with the case in which an Ni-plating solution or a washing solution is used as the cooling liquid. Although the cooling liquid applied to the wiring substrates 1 falls into the Ni-plating tank 33 and is mixed with the plating solution, the plating solution is not adversely affected, since pure water is used as the cooling liquid.

In the present embodiment, the plating layer is formed on the wiring substrates 1 from Ni—P predominantly containing Ni. The Ni-plating layer predominantly containing Ni is easily oxidized at high temperature while the substrates 1 are transferred from the Ni-plating tank 33 to the seventh washing tank 34. Therefore, provision of the cooling step during transfer of the substrates 1 as described above enhances the effect of preventing, among other problems, oxidation of the surface of the Ni-plating layer.

The sprayed cooling liquid (pure water) falls into the Ni-plating tank 33 and is mixed with the plating solution. Consequently, the concentration of the plating solution is lowered. However, according to the present embodiment, when the concentration of the plating solution drops below a predetermined level, fresh plating solution is added to the diluted plating solution such that the concentration of the plating solution is maintained at a constant level. Meanwhile, when the temperature of the plating solution drops below a predetermined level as a result of mixing of the cooling liquid with the plating solution, the plating solution is heated such that the temperature of the solution is maintained at a constant level.

When the sprayed cooling liquid falls into the Ni-plating tank 33 and is contained therein, the level of the plating solution increases. However, according to the present embodiment, an outlet (not illustrated) is provided in the Ni-plating tank 33, and thus when the level of the solution rises above a predetermined level, the excess plating solution is discharged through the outlet. Therefore, the level of the plating solution can be maintained at a constant level.

Figure 4:
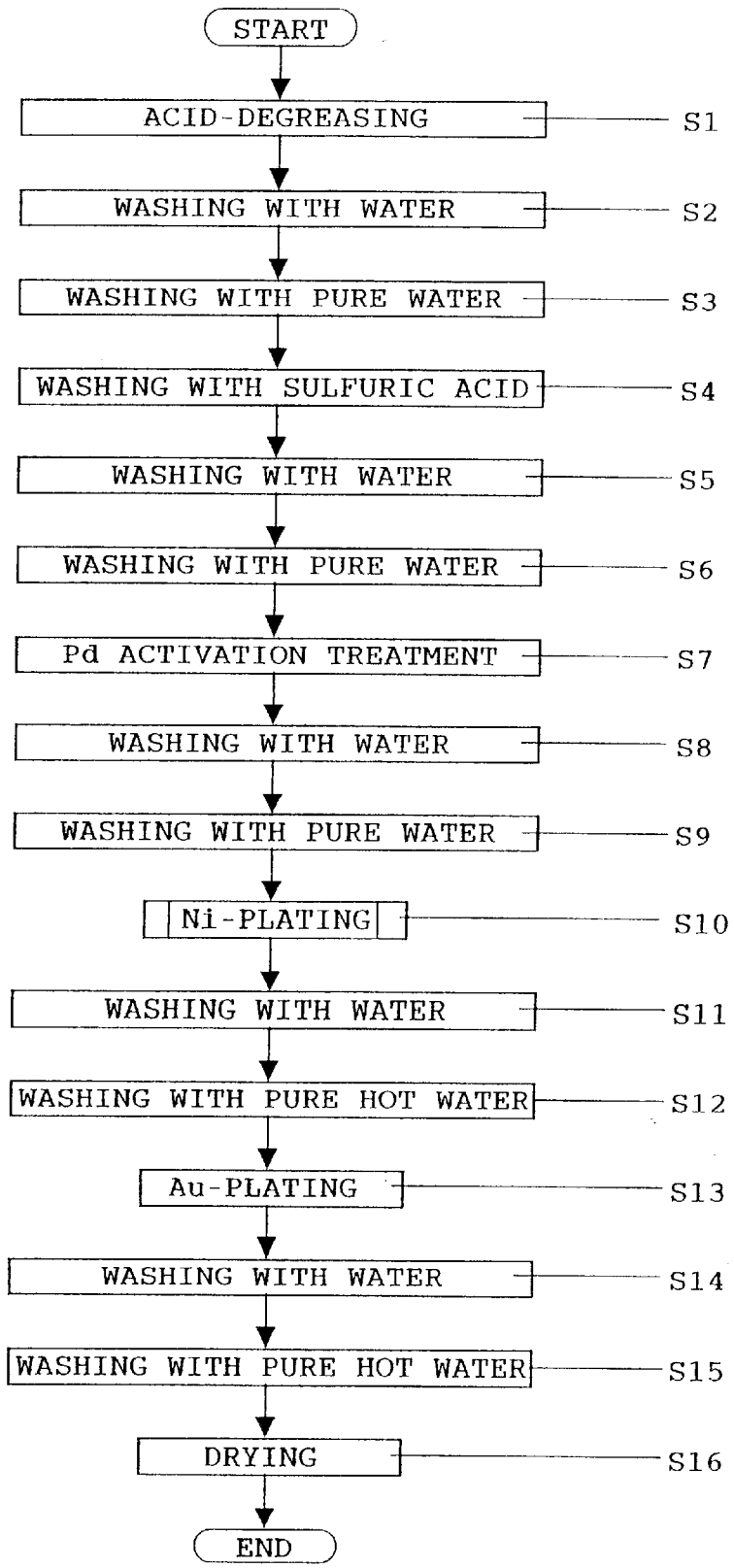
FIG. 4 is a flowchart showing the step for forming an Ni-plating layer and an Au-plating layer of the process for producing a substrate according to an embodiment of the present invention.

Subsequently, as shown in FIG. 4, in step S11, residual plating solution which remains on the wiring substrates 1 is washed off. In step S12, the wiring substrates 1 are washed further.

Specifically, the rack 15 having been transferred horizontally to a position above the seventh washing tank 34 is moved downward by means of the vertical transfer mechanism 17, and the wiring substrates 1 are immersed in a washing solution contained in the seventh washing tank 34. Subsequently, the rack 15 is moved upward by means of the vertical transfer mechanism 17, and is transferred to a position above the eighth washing tank 35 by means of the horizontal transfer mechanism 19. Then, the rack 15 is moved downward by means of the vertical transfer mechanism 17, and the wiring substrates 1 are immersed in a washing solution contained in the eighth washing tank 35, to thereby be washed. Thereafter, the rack 15 is moved upward by means of the vertical transfer mechanism 17, and is transferred to a position above the Au-plating tank 37 (the subsequent tank) by means of the horizontal transfer mechanism 19.

Subsequently, in step S13, an Au-plating layer of predetermined thickness is formed on each of the Ni-plating layers formed on the connection terminals on the main and back surfaces of the individual wiring substrates 1.

Specifically, the rack 15 is moved downward by means of the vertical transfer mechanism 17, and the wiring substrates 1 are immersed in an Au-plating solution for a predetermined period of time, to thereby form an Au-plating layer on the substrates 1. Thereafter, the rack 15 is removed from the Au-plating tank 37 by means of the vertical transfer mechanism 17, and is transferred to a position above the ninth washing tank 38 by means of the horizontal transfer mechanism 19.

Subsequently, in step S14, residual Au-plating solution which remains on the wiring substrates 1 is washed off. In step S15, the wiring substrates 1 are washed further.

Specifically, the rack 15 is moved downward by means of the vertical transfer mechanism 17, and the wiring substrates 1 are immersed in a washing solution contained in the ninth washing tank 38. Subsequently, the rack 15 is removed from the ninth washing tank 38 by means of the vertical transfer mechanism 17, and is transferred to a position above the tenth washing tank 39 by means of the horizontal transfer mechanism 19. Then, the rack 15 is moved downward by means of the vertical transfer mechanism 17, and the wiring substrates 1 are immersed in a washing solution contained in the tenth washing tank 39, to thereby be washed. Thereafter, the rack 15 is removed from the tenth washing tank 39 by means of the vertical transfer mechanism 17, and is transferred by means of the horizontal transfer mechanism 19.

While the wiring substrates 1 are transferred from the Au-plating tank 37 to the ninth washing tank 38, the above-described cooling step is not carried out. This is because, unlike a base metal, Au, which is a precious metal, is not susceptible to chemical reaction, and thus the surface of the Au-plating layer is not easily oxidized even when the wiring substrates 1 are transferred while being heated. Therefore, provision of the aforementioned cooling step is not necessary.

Subsequently, in step S16, the wiring substrates 1 are dried, and production of the wiring substrates 1 is completed.

The wiring substrates 1 are not prone to problems, including blackening of the surface of the Ni-plating layer (between the Ni-plating layer and the Au-plating layer) and formation of an oxidation film. Therefore, even when solder bumps are formed on the connection terminals on the main and back surfaces of the individual wiring substrates 1, reliability of the bonding between the solder and the Ni-plating layer on each of the connection terminals can be enhanced.

The present invention has been described by way of the above embodiment, which should not be construed as limiting the invention thereto, and it is to be understood that modifications and variations may be made without departing from the spirit and scope of the present invention.

In the aforementioned embodiment, while the wiring substrates 1 are transferred from the Ni-plating tank 33 to the seventh washing tank 34, the cooling liquid is applied to the substrates 1 only at a time when the rack 15 is removed from the Ni-plating tank 33, to thereby cool the substrates 1.

However, while the wiring substrates 1 are transferred from the Ni-plating tank 33 to the seventh washing tank 34, the cooling liquid may be applied to the substrates 1 continuously. However, in this case, some of the cooling liquid falls onto the floor. Therefore, as described in the above embodiment, the cooling liquid is preferably applied to the substrates 1 only at a time when the rack 15 is being removed from the Ni-plating tank 33. Since satisfactory cooling of the substrates 1 is attained so long as oxidation of the surface of the Ni-plating layer can be prevented, the cooling liquid is preferably applied to the substrates 1 only for a period of time during which the rack 15 is being removed from the Ni-plating tank 33, from the viewpoint of economy in the amount of the cooling liquid employed.

While the wiring substrates 1 are transferred from the Ni-plating tank 33 to the seventh washing tank 34, the cooling liquid may be applied to the substrates 1 during a period of time when the rack 15 transferred horizontally to a position above the seventh washing tank 34 is being moved downward into the tank 34. In this case, it is preferable to prevent falling of the cooling liquid into the Ni-plating tank 33 and dilution of the plating solution with the cooling liquid. However, in this case, while the heated wiring substrates 1 are transferred from the Ni-plating tank 33 to a position above the seventh washing tank 34, the substrates 1 are exposed to air, and thus the surface of the Ni-plating layer is easily oxidized. Therefore, as described above in the present embodiment, simultaneous cooling of the wiring substrates 1 and removal of rack 15 from the Ni-plating solution is best from the viewpoint of prevention of oxidation of the Ni-plating layer.

In connection with the above embodiment, a process for producing a multi-resin-layer-made wiring substrate in which a number of resin insulating layers and conductive layers are laminated has been described. However, the present invention can be applied to any substrate such as a ceramic substrate, so long as an Ni-plating layer is formed on the substrate.

In the embodiment of the present invention, the Ni-plating layer containing Ni—P is employed as a base-metal plating layer. When the present invention is applied to the case in which a layer plated with a base metal other than Ni—P (e.g., Ni—B) is employed, effects similar to those obtained in the above embodiment can be obtained, since such a plating layer is easily oxidized at high temperature while a substrate including the layer is transferred from a plating tank to the subsequent washing tank.

This application is based on Japanese Patent Application No. 2000-183126, filed Jun. 19, 2000, the disclosure of which is incorporated herein by reference in its entirety.

What is claimed is:

1. A process for producing a substrate comprising a base-metal plating layer, which comprises:

immersing the substrate in a plating solution contained in a plating tank, to thereby form a base-metal plating layer thereon;

removing the substrate from the plating tank, transferring the substrate to a washing tank, and washing the substrate; and simultaneously applying a cooling liquid to the substrate while removing the substrate from the plating tank, to thereby cool the substrate.

2. The process for producing a substrate according to claim 1, which comprises spraying the cooling liquid obliquely upward, and, when falling as a result of spraying, applying the cooling liquid to the substrate from above the substrate.

3. The process for producing a substrate according to claim 1, wherein the cooling liquid is pure water.

4. The process for producing a substrate according to claim 1, wherein the base-metal plating layer is an Ni-plating layer predominantly containing Ni.

* * * * *